United States Patent [19]

Olivenbaum et al.

[11] 4,382,227
[45] May 3, 1983

[54] MULTIPURPOSE TEST EQUIPMENT INPUT CIRCUITRY

[75] Inventors: James E. Olivenbaum, Mesa; Robert H. Bickley, Scottsdale, both of Ariz.

[73] Assignee: Motorola Inc., Schaumburg, Ill.

[21] Appl. No.: 156,885

[22] Filed: Jun. 5, 1980

[51] Int. Cl.³ .................. G01R 15/08; G01R 1/36
[52] U.S. Cl. ..................... 324/115; 324/110; 324/123 R
[58] Field of Search ............ 324/115, 123 R, 110, 324/99 D, 99 R, 120

[56] References Cited

U.S. PATENT DOCUMENTS 2,940,043 6/1960 Nagy, Jr. ................ 324/123 R
2,976,462 3/1962 Miller ..................... 324/110
3,408,569 10/1968 Douglass et al. ........... 324/123 R
3,875,506 4/1975 Cath et al. ............... 324/110

Primary Examiner—Ernest F. Karlsen
Attorney, Agent, or Firm—Eugene A. Parsons

[57] ABSTRACT

An input terminal adapted to receive 0 to 300 volts AC or DC is connected through AC or DC connecting circuits, coupled into the path by switches, and attenuating apparatus including a plurality of ranges automatically switched into the path in response to the amplitude of an input signal, to a buffer which includes overvoltage protection and provides a relatively high input impedance with a relatively low output or source impedance. A frequency counter is connected through a hysteresis amplifier, a digital volt meter is connected through an amplifier including 60 cycle filtering and an oscilloscope is connected through an independent gain amplifier to the output of the buffer.

8 Claims, 2 Drawing Figures

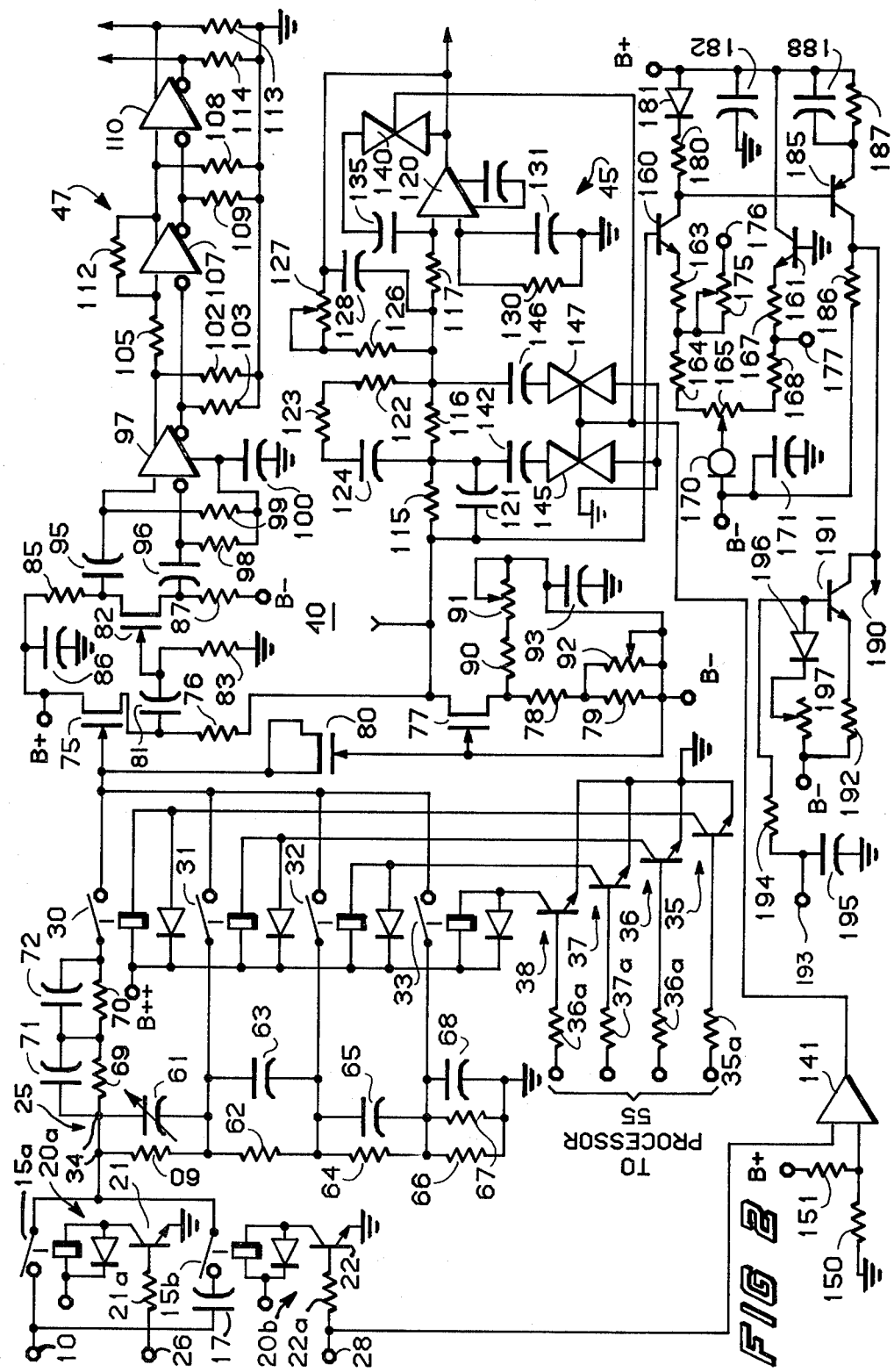

MULTIPURPOSE TEST EQUIPMENT INPUT CIRCUITRY

BACKGROUND OF THE INVENTION

In test equipment utilized for many purposes, such as measuring DC voltages over a plurality of ranges with a digital volt meter, measuring AC voltages over a plurality of ranges with a digital volt meter, counting frequencies, supplying a visual display of input signals on an oscilloscope, etc., it is generally necessary to supply a separate input for each function. Further, each input is generally connected through separate circuits which prepare the input signal for the function to be performed. In some prior art circuitry it is necessary to remove modules and substitute different modules before certain of these tests can be performed. Because it is necessary to change input terminals and/or modules when making a series of various test measurements, testing certain circuitry is cumbersome and tedious.

SUMMARY OF THE INVENTION

The present invention pertains to input circuitry for multipurpose test equipment wherein a single input terminal is adapted to have AC or DC signals ranging from 0 to 300 volts applied thereto. The terminal is connected through AC or DC coupling circuitry and multi-range attenuation apparatus, automatically selected in response to the input signal, to a buffer including overvoltage protection circuitry and a relatively high input impedance with a relatively low output or source impedance. A plurality of selectable circuits each performing a different function are connected to the output of the buffer so that with a single selection switch a plurality of test functions can be performed on a single input signal.

It is an object of the present invention to provide new and improved multipurpose test equipment input circuitry.

It is a further object of the present invention to provide new and improved input circuitry capable of performing a plurality of tests with a single connection of an input terminal to a unit under test.

It is a further object of the present invention to provide new and improved input circuitry including novel overvoltage protection circuitry and filtering of unwanted frequencies.

These and other objects of this invention will become apparent to those skilled in the art upon consideration of the accompanying specification, claims and drawings.

BRIEF DESCRIPTION OF THE DRAWINGS

Referring to the drawings wherein like characters indicate like parts throughout the figures:

FIG. 2 is a schematic diagram of the input circuitry illustrated in FIG. 1.

DESCRIPTION OF THE PREFERRED EMBODIMENT

Figure 1:
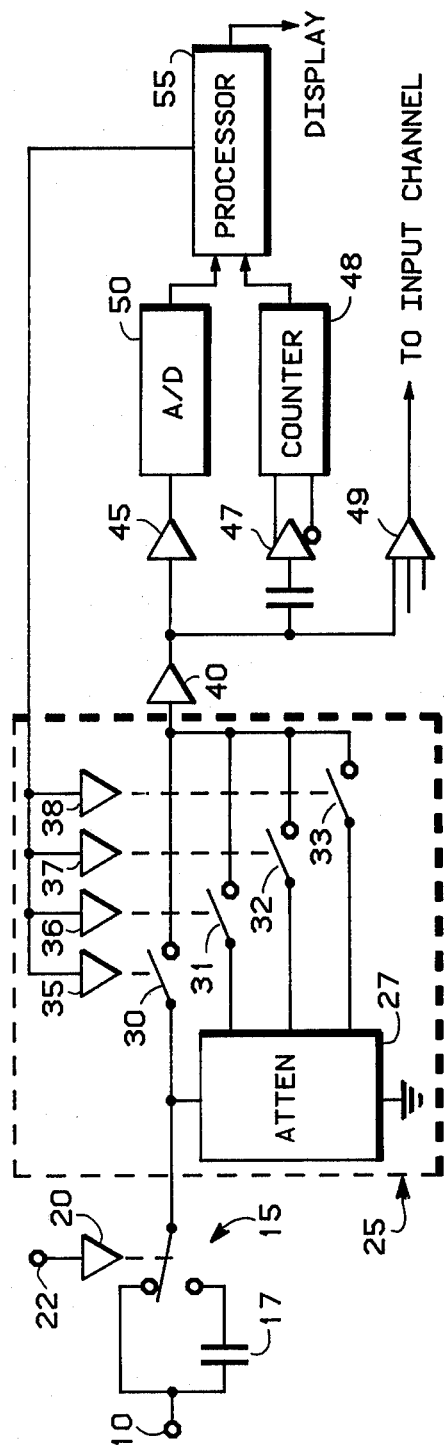
FIG. 1 is a simplified block diagram of multipurpose test equipment input circuitry embodying the present invention.

Referring specifically to FIG. 1, an input terminal 10 for the input circuitry is adapted to be connected to a source of signals, such as test points and the like in equipment to be tested, and may have applied thereto AC or DC signals varying in amplitude between 0 and 300 volts. The input terminal 10 is connected directly to one contact of a switch, generally designated 15, and through an AC coupling capacitor 17 to a second terminal of the switch 15. A moveable contact of the switch 15 is activated into engagement with the first or second contact by means of a circuit 20, illustrated generally as an amplifier. The circuit 20 has an input terminal 22 adapted to receive a signal thereon for selecting between the first or second contacts of the switch 15 and, consequently, between the DC or AC coupling circuits. The moveable contact of the switch 15 is connected to attenuation means, generally designated 25.

The attenuation means 25 includes a bank of attenuators defining four ranges of attenuation, 1, 0.1, 0.01 and 0.001. The various attenuators are connected into the signal path by means of four switches 30, 31, 32 and 33, respectively. Each of the switches 30-33 has an enabling circuit 35-38, respectively, associated therewith. Each of the enabling circuits 35-38 is connected to receive an enabling signal thereon, which may be applied manually or automatically, as will be described presently. The output of the attenuation means 25 is connected to buffer means 40.

The output of the buffer means 40 is connected to three amplifying circuits 45, 47 and 49. The amplifying circuit 45 cooperates with the buffer means 40 to provide DC coupling and unity gain with selectable rejection of 60 hertz signals, with the output of the amplifier 45 being applied through an analog to digital converter 50 to a processor 55. The processor operates as a digital volt meter and supplies signals to a display (not illustrated) for a digital display of the voltage of the input signal at terminal 10. The processor, in this embodiment, supplies signals to the enable circuits 35-38 to automatically control the attenuation means 25 to the correct range in response to an input signal at the terminal 10.

The second amplifier 47 includes hysteresis and supplies signals to a counter 48, the output of which is supplied to the processor 55 for frequency counting. The hysteresis prevents false triggering of the counter on noise.

The third amplifier 49 is a differential amplifier whose gain is independent of the input signal and the output is supplied to the vertical input of an oscilloscope for visual display of the input signal at terminal 10.

The apparatus illustrated in simplified block form in FIG. 1 is illustrated schematically in FIG. 2 and like components are designated with like numbers. In FIG. 2 the switch 15 includes two relay sections 15a and 15b, each composed of a fixed contact, a moveable arm and a coil for moving the arm, with the moveable arms illustrated in a de-energized position. The input terminal 10 is connected to the fixed contact of the relay section 15a and, through the capacitor 17 to the fixed contact of the relay section 15b. The moveable arms of the relay sections 15a and 15b are connected to an input junction 34 of the attenuation means 25. Circuitry for energizing the coils associated with each of the relay sections 15a and 15b are designated 20a and 20b, respectively. One side of each of the coils is connected to a terminal designated B++ adapted to receive a positive voltage thereon, for example 12 volts. The opposite sides of each of the relay coils are each connected to a collector of a NPN type of transistor 21 and 22, respectively, the emitters of which are both grounded. The basis of each of the transistors 21 and 22 are connected to two terminals 26 and 28 through two current limiting resistors 21a and 22a, respectively. The two terminals 26 and 28 may be connected to an external switch for selecting AC or DC input and/or they may be connected to the processor 55 for selecting a specific input when a particular function is selected. The energizing circuits illustrated are utilized because of their simplicity and it will be understood by those skilled in the art that a variety of energizing circuits might be selected. Closure of the relay section 15a completes a DC circuit in the signal path from the terminal 10, and closure of the relay section 15b completes an AC circuit in the signal path.

The output of the relay 15 is connected to the input junction 34 of the attenuation means 25, and a four step resistive/capacitive ladder is connected between the junction 34 and ground. The first step of the ladder having one side connected to the junction 34 includes a resistor 60 and a variable capacitor 61 connected in parallel. The variable capacitor 61 is included to provide a frequency response compensation adjustment. The second step of the ladder includes a resistor 62 and a capacitor 63 connected in parallel and in series with the first step. The third step of the ladder includes a resistor 64 and a capacitor 65 connected in parallel and in series with the first two steps. The fourth step of the ladder includes a resistor 66, a resistor 67 and a capacitor 68 connected in parallel with the parallel combination connected in series between ground and the third step. The switches 30, 31, 32 and 33 are each embodied by a relay including a moveable arm, a fixed contact and a relay coil. One side of each of the coils is connected to a terminal designated B++ adapted to have a positive source of voltage connected thereto, such as 12 volts. The opposite side of each of the relay coils are connected to the collectors of four NPN type transistors 35, 36, 37 and 38, respectively, the emitters of which are each connected to ground. The bases of each of the transistors 35 through 38 are each connected through separate current limiting resistors to the processor 55.

The junction 34 is connected through two series connected current limiting resistors 69 and 70 to the moveable contact of the relay 30. A capacitor 71 is connected in parallel with the resistor 69 and a capacitor 72 is connected in parallel with the resistor 70 to provide the proper response for AC signals. The junction of the resistors 60 and 62 in the attenuation ladder is connected to the moveable contact of the relay 31. The junction of the resistors 62 and 64 in the attenuation ladder is connected to the moveable contact of the relay 32. The junction of the resistors 64 and 66 of the attenuation ladder is connected to the moveable contact of the relay 33. Each of the stationary contacts of the relays 30–33 are connected directly to the gate of a junction field effect transistors (JFET) 75 forming a portion of the buffer means 40.

In the present embodiment the correct step of the ladder, or range, for the attenuation means 25 is selected by the processor 55 through a signal supplied to the base of one of the transistors 35–38. For the processor to select the correct range in response to an input signal at the input terminal 10, the attenuation means must normally be in the lowest attenuating step which allows the initial input signal to pass through the circuitry to the processor 55. The processor 55 then compares the signal to determine if the amplitude is too high and if it is the transistor 36 is energized and transistor 35 deenergized. After a second comparison if the amplitude is still too high the transistor 37 is energized and transistor 36 deenergized, etc. While this process occurs extremely rapidly, an over-voltage is present at the JFET 75 and could cause damage. Also, if the attenuation means 25 is operated manually instead of by the processor 55 temporary over-voltages could be applied to the JFET 75. Therefore, over-voltage protection circuitry is required.

The gate of the JFET 75 serves as an input junction for the buffer means 40. The drain of the JFET 75 is connected directly to a terminal designated B+, adapted to have a positive source of voltage applied thereto, such as 8 volts. The source of the JFET 75 is connected through a resistor 76 to the drain of a second JFET transistor 77. The source of the JFET 77 is connected through two resistors 78 and 79, connected in series, to a terminal designated B− adapted to have a negative source of voltage applied thereto, such as a −8 volts. The gate of the JFET 77 is connected directly to the B− terminal and to the gate of a JFET 80. The source and drain of the JFET 80 are connected together and to the gate of the JFET 75 to form a diode between the gates of the JFETs 75 and 77. The source of the JFET 75 is connected through a capacitor 81 to the gate of a JFET 82, which is also connected to ground through a resistor 83. The drain of the JFET 82 is connected through a resistor 85 to the terminal designated B+. A decoupling capacitor 86 is also connected between the terminal B+ and ground. The source of the JFET 82 is connected through a resistor 87 to the terminal B−. The source of the JFET 77 is connected through a resistor 90 and a potentiometer 91, connected in series, to the B− terminal. The junction of the resistor 78 and 79 is connected through a potentiometer 92 to the B− terminal. The potentiometers 91 and 92 form zeroing adjustments for the buffer means 40. A decoupling capacitor 93 is connected from the B− terminal to ground. The buffer means 40 provides a differential output across the JFET 82 and a single ended output at the drain of the JFET 77.

In the operation of the buffer means 40, the JFET 77 provides a type of current mirror operation so that the drain of the JFET 77 generally is at the same voltage and follows the gate of the JFET 75. Therefore, the buffer means 40 has a very high impedance input, much greater than 1 megohm resistive, and provides an output or source impedance at the double ended outputs and the single ended output of a relatively low impedance or approximately 100 ohms. The JFET 80, which is connected to the −8 volt supply operates to clamp the gate of the JFET 75 at a maximum negative voltage of approximately −8.6 volts. Thus, even when the input signal at the terminal 10 approaches a negative 300 volt amplitude the JFETs in the buffer means 40 are protected by the clamping actions of the JFET 80. When the input signal is positive the gate junction of JFET 75 conducts and the current limiting resistors 69 and 70 prevent the current flowing into the gate of the JFET 75 from reaching a value which will damage the JFET 75. Likewise, resistors 69 and 70 limit current in JFET 80 when the input is negative. Generally the positive voltage at the gate of the JFET 75 will not exceed approximately 8.6 volts, even if the input voltage at the terminal 10 is 300 volts positive and the attenuation means 25 is in the attenuation of 1 position. The buffer means 40 provides a gain of approximately 0.97 for DC signals applied thereto and approximately 0.95 for AC signals applied thereto.

The drain and source of the JFET 82 are connected through capacitors 95 and 96, respectively, to the two inputs of a differential amplifier 97. The two inputs are also connected through resistors 98 and 99, respectively, to one side of a capacitor 100, the other side of which is grounded. First and second outputs of the differential amplifier 97 are connected through resistors 102 and 103, respectively, to ground. The first output of the differential amplifier 97 is also connected through a series resistor 105 to a first input of a second differential amplifier 107 and the second output of the differential amplifier 97 is connected directly to a second input of the differential amplifier 107. First and second outputs of the differential amplifier 107 are connected through resistors 108 and 109, respectively, to ground and to first and second inputs of a third differential amplifier 110. The first output of the differential amplifier 107 is also connected to the first input thereof by means of a resistor 112. The positive feedback provided by the resistor 112 and resistor 105 produces hysteresis in the amplifier which substantially reduces false triggering on noise and the like. First and second outputs of the differential amplifier 110 are connected through resistors 113 and 114, respectively, to ground and are connected to the frequency counter 48 (FIG. 1). The amplifiers 97, 107 and 110 overdrive and clip sinewaves applied thereto so that the output is a substantially square wave alternating about 0 and the frequency counter 48 may include a 0 crossing detector to determine the number of crossings and, hence, the frequency. Because of the hysteresis present in the amplifier 107, much of the noise present in the system will not have sufficient amplitude to produce a 0 crossing and will not produce a count.

The drain of the JFET 77 is coupled through three series connected resistors 115, 116 and 117 to the negative or inverting input of an operational amplifier 120. A capacitor 121 is connected in parallel with the resistor 115. A resistor 122, a resistor 123 and a capacitor 124 are connected in series and the series combination is connected in parallel with the resistor 116. A resistor 126 and a potentiometer 127 are connected in series and the series combination is connected between the junction of the resistors 116 and 117 and the output of the operational amplifier 120. A capacitor 128 is also connected between the junction of the resistors 116 and 117 and the output of the operational amplifier 120. A resistor 130 and a capacitor 131 are connected in parallel between the positive or non-inverting input of the operational amplifier 120 and ground.

A capacitor 135 has one side connected to the negative or inverting input of the operational amplifier 120 and the other end connected through a transmission gate 140 to the output of the operational amplifier 120. The enabling input of the transmission gate 140 is connected to the output of an operational amplifier 141. A capacitor 142 has one side connected to the junction of the resistors 115 and 116 and the other side connected through a transmission gate 145 to ground. A capacitor 146 has one side connected to the junction of the resistors 116 and 117 and the other side connected through a transmission gate 147 to ground. The enabling inputs of the transmission gates 145 and 147 are both connected to the output of the operational amplifier 141. The positive or non-inverting input of the operational amplifier 141 is connected through a resistor 150 to ground and through a resistor 151 to the B+ terminal. The negative or inverting input of the operational amplifier 141 is connected to the input terminal 28, which is adapted to receive a positive signal which connects the AC circuit into the signal path.

In the operation of the circuitry described above, the operational amplifier 120 and its associated circuitry, is utilized to amplify AC or DC signals supplied by the buffer means 40 and apply the amplified signals to the analog-to-digital converter 50. When AC signals are being applied through the relay section 15b a positive signal is present at the terminal 28 (to turn on the transistor 22) which positive signal causes the operational amplifier 141 to provide a low signal at the output thereof. The low signal at the output of the operational amplifier 141 turns off the three transmission gates 140, 145 and 147, thereby removing the capacitors 135, 142 and 146 from the circuit and allowing AC signals to pass, unattenuated through the amplifier.

When DC signals are being applied to the circuitry the relay segment 15a is closed and the signal at the terminal 28 is low so that the relay segment 15b is deactivated. The low signal at the terminal 28 also turns on the operational amplifier 141 which activates the transmission gates 140, 145 and 147. The activated transmission gates connect the capacitors 135, 142 and 146 into the circuitry. The capacitor 142 cooperates with the resistor 115 to provide the first pole of a three pole filter. The capacitor 146 cooperates with the resistor 116 and the capacitor 135 cooperates with the resistor 117 to provide the other two poles. The resistor capacitor combinations in conjunction with the operational amplifier 120 cooperate to produce a three pole active filter having approximately 30 db rejection at 60 hertz. Thus, any AC present in the DC signal being measured will be substantially reduced, or eliminated, by the described active filter. Further, the operational amplifier 120 and its associated circuitry provide a DC gain of approximately 1.03 and an AC gain of approximately 1.05. This gain in conjunction with the previously stated gains of the buffer means 40 normalizes the circuits to unity gain.

A pair of NPN type transistors 160 and 161, along with their associated circuitry form a differential amplifier for receiving AC or DC signals from the buffer means 40 and supplying them to the vertical input of an oscilloscope. The drain of the JFET 77 is connected to the base of the transistor 160 and the base of the transistor 161 is connected to ground. The emitter of the transistor 160 is coupled through a pair of series connected resistors 163 and 164 to one end of a balance potentiometer 165. The emitter of the transistor 161 is coupled through a pair of series connected resistors 167 and 168 to the other side of the balance potentiometer 165. The moveable contact of the potentiometer 165 is connected to the anode of a constant current diode 170, the cathode of which is connected to the B— terminal. The cathode of the diode 170 is also connected through a decoupling capacitor 171 to ground. The junction of the resistors 163 and 164 is connected to the moveable arm and one end of a potentiometer 175, the other end of which is connected to an output terminal 176 which serves as a vertical gain return. The junction of the resistors 167 and 168 is connected directly to a terminal 177 adapted to have a vertical gain control applied thereto. Thus, the vertical gain control is applied between the terminals 177 and 176 with the potentiometer 175 operating as a calibration adjustment.

The collector of the transistor 160 is connected through a resistor 180 to the cathode of a diode 181, the anode of which is connected to the B+ terminal. The collector of the transistor 161 is connected directly to the B+ terminal and a decoupling capacitor 182 is connected between the B+ terminal and ground. A PNP type of transistor 185 has its base connected to receive an output of the differential amplifier at the collector of the transistor 160. The collector of the transistor 185 is connected to the B— terminal through a resistor 186. The emitter of the transistor 185 is connected to the B+ terminal through a resistor 187 having a by-pass capacitor 188 connected in parallel therewith. The collector of the transistor 185 is also connected to an output terminal 190 adapted to be connected to the vertical input of an oscilloscope.

An NPN type transistor 191, along with its associated circuitry, provides vertical positioning means for the signal applied to the oscilloscope. The collector of the transistor 191 is connected to the collector of the transistor 185. The emitter of the transistor 191 is connected to the B— terminal through a resistor 192. The base of the transistor 191 is connected to a vertical position input terminal 193 through a resistor 194. A decoupling capacitor 195 is also connected from the input terminal 193 to ground. The base of the transistor 191 is connected to the anode of a diode 196, the cathode of which is connected to the center arm of a potentiometer 197. One side of the potentiometer 197 is connected to the B— terminal.

The described differential amplifier (transistors 160 and 161) provides a relatively gain independent amplifier for supplying signals from the buffer means 40 to an oscilloscope for visual observation thereof. The differential amplifier and its associated circuitry essentially controls current by way of transistor 191 to control vertical position and the gain of the differential amplifier is independent of the vertical position current.

Typical values for the components illustrated schematically in FIG. 2 are listed below.

| COMPONENT | VALUE | COMPONENT | VALUE |
|---|---|---|---|
| Resistors | Ohms | Capacitors | |
| 21a | 4700 | 17 | .02 µf |
| 22a | 4700 | 61 | 1–6.5pf |
| 23a | 4700 | 63 | 33pf |
| 35a | 4700 | 65 | 470pf |
| 36a | 4700 | 68 | 4700pf |
| 37a | 4700 | 71 | .01 µf |
| 38a | 4700 | 72 | 1000pf |
| 60 | 909k | 81 | .05 µf |
| 62 | 90.9k | 86 | .1 µf |
| 64 | 9090 | 93 | .1 µf |
| 66 | 1020 | 95 | 47 µf |
| 67 | 100k | 96 | 47 µf |
| 69 | 100k | 100 | .1 µf |
| 70 | 10k | 121 | 470pf |
| 76 | 51 | 124 | 2200pf |
| 78 | 39 | 128 | 10pf |
| 79 | 33 | 131 | 68pf |
| 83 | 1M | 135 | .01 µf |
| 85 | 150 | 142 | .2 µf |
| 87 | 470 | 146 | .1 µf |
| 90 | 470 | 171 | .1 µf |
| 91 | 100 | 182 | .1 µf |
| 92 | 100 | 188 | 1000pf |
| 98 | 470 | 195 | .1 µf |
| 99 | 470 | | |
| 102 | 470 | | |
| 103 | 470 | | |
| 105 | 820 | Transistors | |
| 108 | 470 | 21 | MPS 6520 |
| 109 | 470 | 22 | MPS 6520 |
| 112 | 270 | 23 | MPS 6520 |
| 113 | 470 | 35 | MPS 6520 |
| 115 | 33k | 36 | MPS 6520 |
| 116 | 220k | 37 | MPS 6520 |
| 117 | 470k | 38 | MPS 6520 |

-continued

| COMPONENT | VALUE | COMPONENT | VALUE |
|---|---|---|---|
| 122 | 4.7M | 75 | ½ E431 |
| 123 | 4.7M | 77 | ½ E431 |
| 126 | 240k | 80 | J308 |
| 127 | 0–50k | 32 | J308 |
| 130 | 470k | 160 | MPS 6520 |
| 150 | 22k | 161 | MPS 6520 |
| 151 | 68k | 185 | MPS 6519 |
| 163 | 51 | 191 | MPS 6520 |
| 164 | 5600 | | |
| 165 | 0–2k | All diodes, except 170 | |
| 167 | 51 | which is an 1N5302, are | |
| 168 | 5600 | 1N4148. | |
| 175 | 0–500 | | |
| 180 | 3.83k | | |
| 186 | 1.47k | | |
| 187 | 261 | | |
| 192 | 270 | | |
| 194 | 820 | | |
| 197 | 0–500 | | |

Thus, improved multipurpose test equipment input circuitry is disclosed which is capable of providing a plurality of functions, in the present embodiment digital voltmeter measurements, frequency counter measurements and visual displays on an oscilloscope, from the application of signals to a single input terminal. Further, the circuitry includes over-voltage protection circuitry so that substantially any signal can be connected to the input terminal without damaging the circuitry. Further, the circuitry contains many improvements for rapid and accuracte measurements with simplicity of connection to circuits under test. While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of the invention.

We claim:

1. Multipurpose test equipment input circuitry comprising:
    (a) input means including a single input terminal for receiving AC and DC signals;
    (b) switching means connected to said input means for selecting one of an AC and DC coupling circuit;
    (c) attenuation means connected to said coupling circuits for receiving input signals from said input means and attenuating the amplitude of the input signals to at least a predetermined value;
    (d) buffer means connected to said attenuation means for providing a relatively high input impedance at said input means and a relatively low source impedance for circuitry attached to an output thereof, and including circuitry for preventing damage to said buffer means upon the application of greater than a predetermined amplitude of signal to said buffer means, said buffer means including first field effect transistor means providing the relatively high input impedance with current limiting resistance in series with an input gate thereof to provide protection against overloads of a first polarity and second junction field effect transistor means connected as a diode to the input gate to provide protection against overloads of a second polarity; and
    (e) a plurality of circuits connected to the output of said buffer means, each of said circuits providing signals for a different function of multipurpose test equipment in response to the application of signals from said buffer means.

2. Multipurpose test equipment input circuitry as claimed in claim 1 wherein the attenuation means includes a plurality of attenuators and switching circuitry for connecting an appropriate one of said attenuators in circuit between said coupling circuit and said buffer means and said input circuitry further including a microprocessor coupled to said switching circuitry to automatically adjust said attenuation means to the correct attenuator for any input signal.

3. Multipurpose test equipment input circuitry as claimed in claim 1 wherein one of the plurality of circuits includes an operational amplifier connected to the buffer means and cooperating therewith to form a multiple filter for eliminating AC from the power source and for providing substantially unity gain with the input circuitry in the AC and DC modes, the output of the operational amplifier is adapted to be connected to a digital volt meter through an analog to digital converter.

4. Multipurpose test equipment input circuitry as claimed in claim 1 wherein one of the plurality of circuits includes amplifying means for converting the input signal to square waves said amplifying means being adapted to be connected to a frequency counter, the amplifying means further including circuitry having hysterisis therein for substantially reducing false triggering because of noise.

5. Multipurpose test equipment input circuitry as claimed in claim 4 wherein the circuitry having hysteresis therein includes an operational amplifier with positive feedback.

6. Multipurpose test equipment input circuitry as claimed in claim 1 wherein one of the circuits includes amplifying means having an output adapted to be connected to an oscilloscope for visual display of signals applied thereto.

7. Multipurpose test equipment input circuitry as claimed in claim 1 wherein the plurality of circuits includes circuits providing signals for a digital voltmeter, circuits providing signals for a frequency counter, and circuits providing signals for visual display on an oscilloscope.

8. Multipurpose test equipment input circuitry as claimed in claim 1 including circuitry for automatically adjusting the attenuation means to a correct range of a plurality of ranges in response to an input signal.

* * * * *